(12) United States Patent
Fukuyama

(10) Patent No.: US 7,363,558 B2
(45) Date of Patent: Apr. 22, 2008

(54) SEMICONDUCTOR DEVICE AND METHOD FOR TESTING THE SAME

(75) Inventor: Hiroyuki Fukuyama, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 587 days.

(21) Appl. No.: 10/937,607

(22) Filed: Sep. 10, 2004

(65) Prior Publication Data

US 2005/0034021 A1    Feb. 10, 2005

Related U.S. Application Data

(62) Division of application No. 10/446,077, filed on May 28, 2003, now Pat. No. 6,826,101.

(30) Foreign Application Priority Data

May 28, 2002    (JP) .............................. 2002-154592

(51) Int. Cl.
  *G01R 31/28*    (2006.01)
  *G11C 29/00*    (2006.01)
  *G11C 11/34*    (2006.01)
(52) U.S. Cl. ...................... 714/724; 714/718; 364/201; 364/185.33
(58) Field of Classification Search .................... None
  See application file for complete search history.

(56) References Cited

U.S. PATENT DOCUMENTS

| | | | | |
|---|---|---|---|---|
| 5,384,784 A | * | 1/1995 | Mori et al. ................. | 714/718 |
| 6,094,736 A | * | 7/2000 | Komoike ..................... | 714/726 |
| 6,101,457 A | * | 8/2000 | Barch et al. ................ | 702/117 |
| 6,272,069 B2 | * | 8/2001 | Tomita et al. .............. | 365/233 |
| 6,473,873 B1 | | 10/2002 | Akamatsu et al. | |
| 6,519,171 B2 | * | 2/2003 | Matsuzaki et al. ............ | 365/51 |
| 6,681,351 B1 | * | 1/2004 | Kittross et al. ............. | 714/724 |
| 6,711,042 B2 | * | 3/2004 | Ishikawa ..................... | 365/51 |

FOREIGN PATENT DOCUMENTS

| | | |
|---|---|---|
| JP | 11-052021 | 2/1999 |
| JP | 11-153650 | 6/1999 |
| JP | 11-174121 | 7/1999 |
| JP | 11-174122 | 7/1999 |
| JP | 11-250696 | 9/1999 |
| JP | 2001-183420 | 7/2001 |

* cited by examiner

*Primary Examiner*—Phung M. Chung
(74) *Attorney, Agent, or Firm*—Rabin & Berdo, P.C.

(57) ABSTRACT

A semiconductor device, according to the present invention, includes an external input terminal to which first and second input test signals are supplied; a memory circuit, in which a test operation is performed in accordance with the first input test signal to provide a first test result signal; a logic circuit, in which a test operation is performed in accordance with the second input test signal to provide a second test result signal; an external output terminal from which the first and second test result signals are outputted selectively; and a switch circuit which selectively couples the memory circuit and the logic circuit to the external input terminal and the external output terminal.

14 Claims, 15 Drawing Sheets

SEMICONDUCTOR DEVICE AND METHOD FOR TESTING THE SAME

CROSS REFERENCE TO RELATED APPLICATION

This is a Divisional of U.S. application Ser. No. 10/446,077, filed May 28, 2003, and now U.S. Pat. No. 6,826,101.

TECHNICAL FIELD OF THE INVENTION

This invention relates to a semiconductor device (apparatus) including a memory circuit and a logic circuit, and a method for testing the same.

BACKGROUND OF THE INVENTION

Conventionally, the Boundary-Scan method has been used for testing a semiconductor device, which is shown in Japanese Patent Publication, Kokai 2001-183420. According to the boundary-scan technique, the specification of the test is determined by, for example, IEEE1149.1. Therefore, the same test pattern signal can be used for a variety of semiconductor device made by different manufactures.

According to a conventional method of test for a semiconductor device, including a memory circuit it is required to carry out tests for the memory circuit and for another logic circuit independently or separately from each other. As a result, it spends a longer period of time to test a semiconductor device, including a memory circuit.

OBJECTS OF THE INVENTION

Accordingly, an object of the present invention is to provide a semiconductor device in which an operation test can be performed for a short period of time.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a semiconductor device includes an external input terminal to which first and second input test signals are supplied; a memory circuit, in which a test operation is performed in accordance with the first input test signal to provide a first test result signal; a logic circuit, in which a test operation is performed in accordance with the second input test signal to provide a second test result signal; an external output terminal from which the first and second test result signals are outputted selectively; and a switch circuit which selectively couples the memory circuit and the logic circuit to the external input terminal and the external output terminal.

According to a second aspect of the present invention, a method for testing a semiconductor device, including the steps of: inputting a first test signal for a memory circuit during a first period of time; performing a writing test operation of the memory circuit in accordance with the first test signal during a second period of time; and inputting a second test signal for a logic circuit and performing a test operation of the logic circuit during a third period of time, which is within the second period of time;

As described above, according to the present invention, the total test time for a semiconductor device is remarkably shortened.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
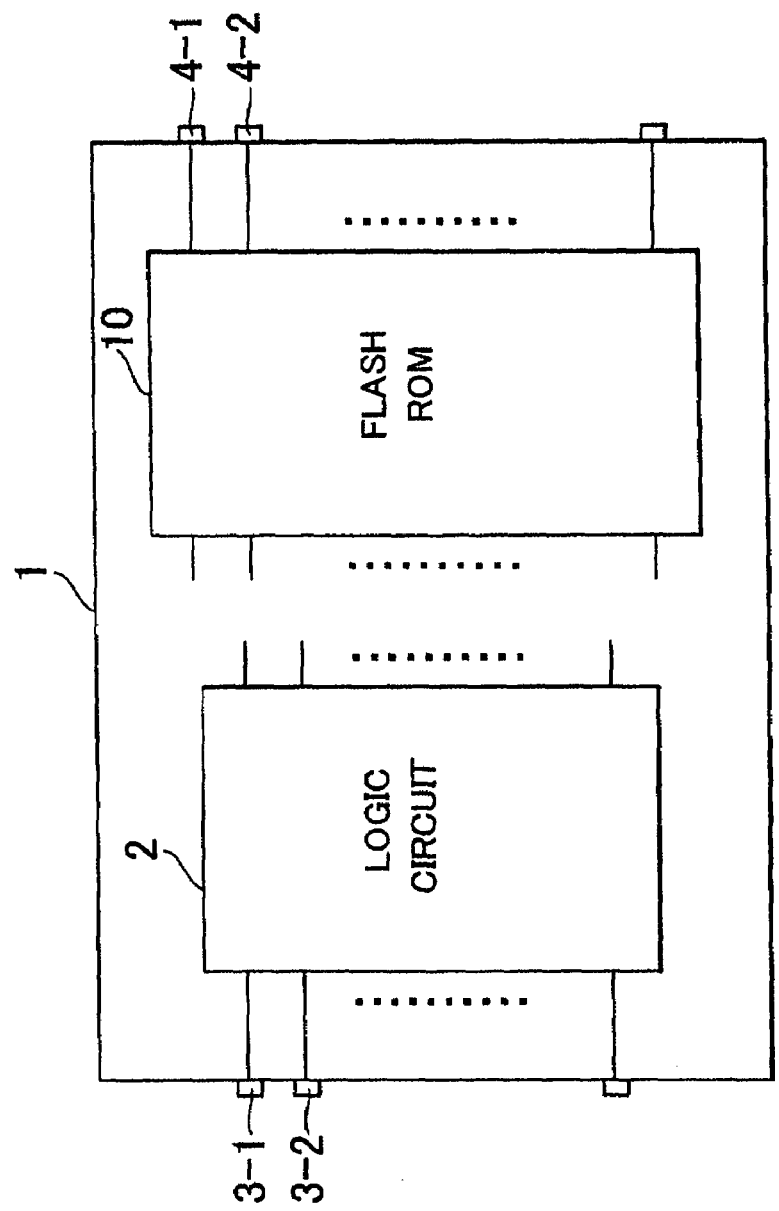
FIG. 1 is a block diagram illustrating a conventional semiconductor device, including a flash ROM and a logic circuit.

FIG. 1 is a block diagram illustrating a conventional semiconductor device, including a flash ROM 10 and a logic circuit 2. The logic circuit 2 may be a CPU or the like. The logic circuit 2 includes terminals, which are connected to external terminals 3-1, 3-2, . . . to be accessed from an external test circuit for easy analyzing of operation. In the same manner, the flash ROM 10 includes terminals, which are connected to external terminals 4-1, 4-2, . . . to be accessed from an external test circuit for easy analyzing of operation. The external terminals 3-1, 3-2, 4-1 and 4-2 are connected to selector circuits so that those terminals can be connected to another external circuit in a normal operating mode.

When tests of the logic circuit 2 and the flash ROM 10 are performed, predetermined test patterns are supplied to the external terminals 3-1, 3-2, 4-1 and 4-2. Generally, the tests of the logic circuit 2 and the flash ROM 10 are performed independently.

Figure 2:
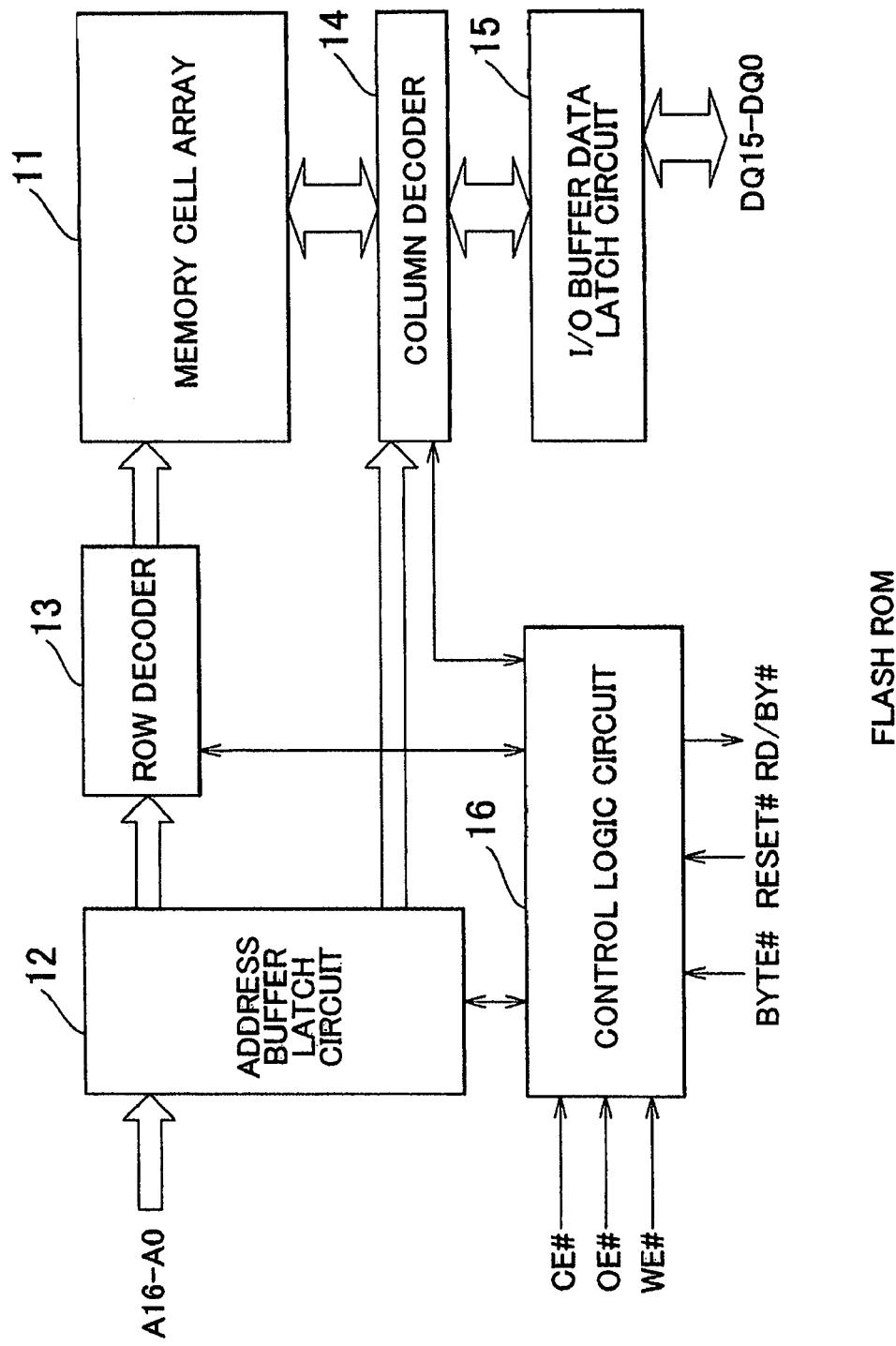
FIG. 2 is a block diagram showing the detail of the flash ROM, shown in FIG. 1.

FIG. 2 is a block diagram showing the detail of the flash ROM 10, shown in FIG. 1.

In the flash ROM 10, stored data can be deleted all together and for each small sector, so that data are easily written and read. For example, the flash ROM 10 includes a memory cell array 11 having a formation of 256K words×8 bits, 128K words×16 bits, or the like. Address signals A16 to A0, designating the memory cell array 11, are latched by an address buffer/latch circuit 12. An X address, latched by the address buffer latch circuit 12, is decoded by a row decoder 13, so that a word line of the memory cell array 11 is selected. A Y address, latched by the address buffer latch circuit 12, is decoded by a column decoder 14, so that a bit line of the memory cell array 11 is selected.

Data signals DQ15 to DQ0 to be written are latched by an I/O buffer data latch circuit 15 and transferred to the bit line selected by the column decoder 14. The data is written at an intersection between the bit line and the word line, selected by the row decoder 13. The written data is read out through the bit line, and is latched by the I/O buffer data latch circuit 15. The latched data is outputted as data signals DQ15 to DQ0.

A control logic circuit 16 controls reading and writing operation of the memory sell array 11. The control logic circuit 16 is supplied with command signals, including a chip select signal CE#; an output enable signal OE#; and a write enable signal WE#. The control logic circuit 16 is also supplied with a byte signal BYTE# and a reset signal RESET#. The control logic circuit 16 controls the flash ROM 10 so that a ready/busy signal RD/BY# is in a busy state "0" during writing operation, and is in a ready state "1" when the writing operation is completed.

For testing the flash ROM 10, a test pattern for one word (8 bits or 16 bits) writing operation is supplied to the external terminals 4-1, 4-2 . . . during a pattern input period for write command. The inputted test pattern is latched by the I/O buffer data latch circuit 15. The latched data is written in the memory cell array 11 within a non-volatile program period, following the pattern input period. During the non-volatile program period, no test pattern is written in the flash ROM 10. The non-volatile program period can be called a waiting period and spends 200 μs/word maximum.

When a writing operation for one word is completed, a test pattern for the next word is inputted. This operation or process is repeated for all the bits of the memory cell array 11. After that, the read data are tested by an external tester.

Figure 3:
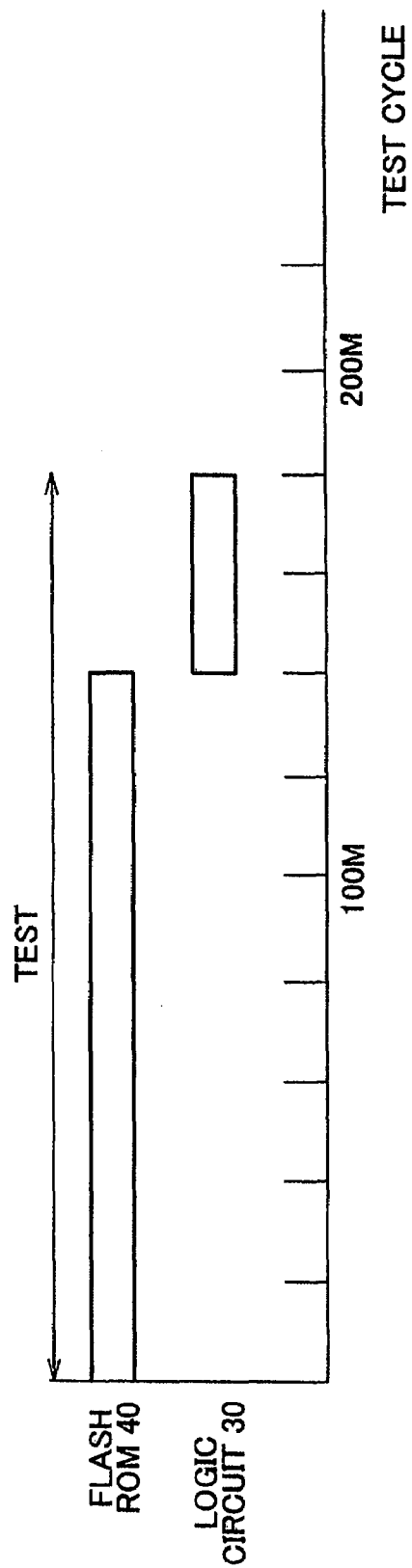
FIG. 3 is a timing chart showing a test operation of the conventional semiconductor device, shown in FIG. 1.

FIG. 3 is a timing chart showing a test operation of the conventional semiconductor device, shown in FIG. 1. According to the above-described conventional method of test for a semiconductor device, the external terminals 4-1, 4-2 . . . are occupied during the non-volatile program period, and the terminals 4-1, 4-2 . . . cannot be used for another purpose. As shown in FIG. 3, it is required to carry out tests for the flash ROM 10 and for the logic circuit 2 independently or separately from each other. As a result, it spends a longer period of time to test a semiconductor device 1 including the flash ROM 10.

Figure 4:
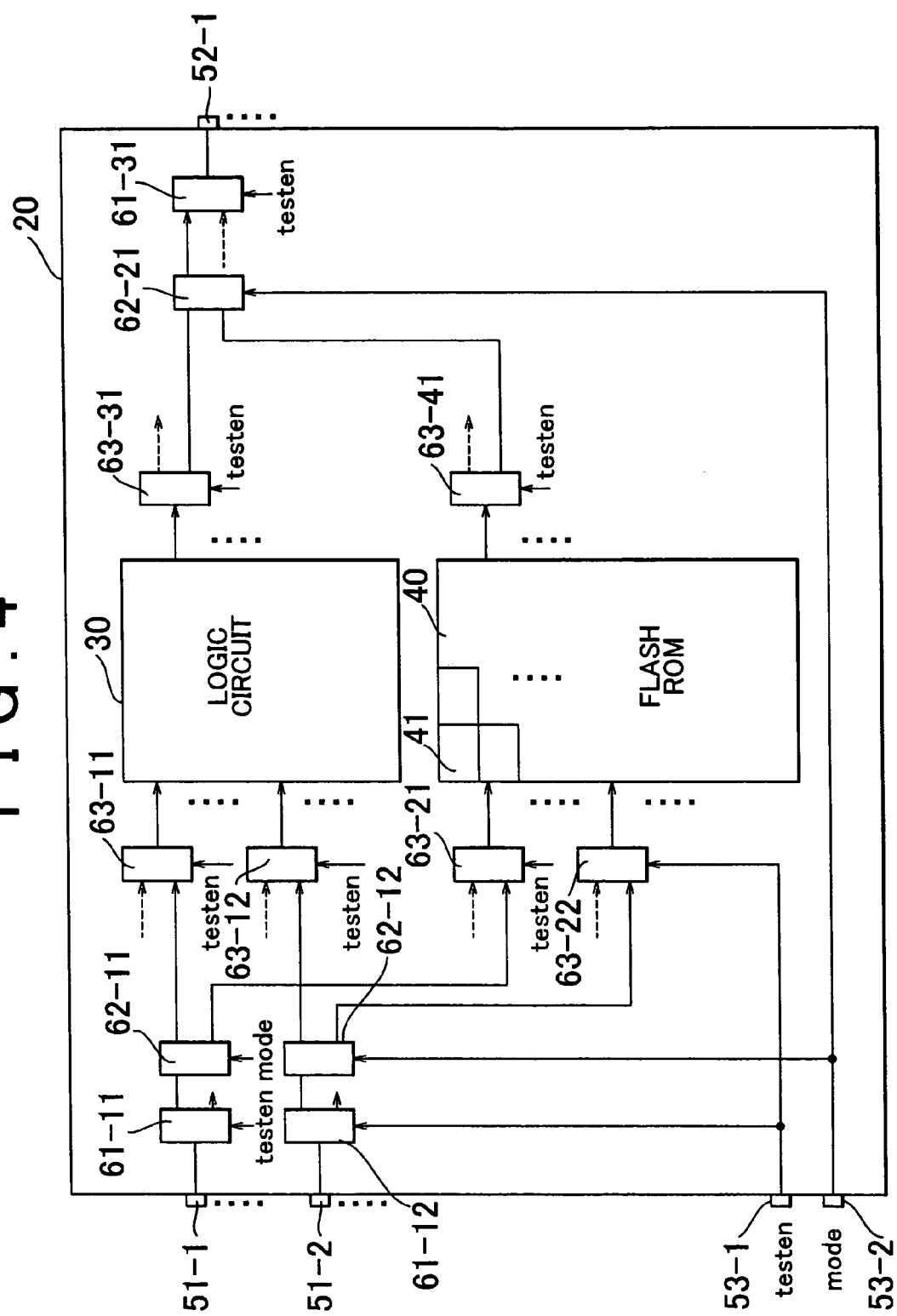
FIG. 4 is a block diagram showing a semiconductor device according to a first preferred embodiment of the present invention.

FIG. 4 is a block diagram showing a semiconductor device according to a first preferred embodiment of the present invention. A semiconductor device 20 includes a logic circuit 30, for example, CPU, and a memory circuit 40, for example, flash ROM 40 on the common substrate and in the same chip. The flash ROM 40 includes a memory cell array 11, which may have a formation (capacitance) of 256K words×8 bits, 128K words×16 bits, or the like. The logic circuit 30 and the flash ROM 40 may have the same number of terminals.

The semiconductor device 20 includes external input terminals 51-1, 51-2 . . . , external output terminals 52-1 . . . , an external control terminal 53-1, and another external control terminal 53-2. The external input terminals 51-1, 51-2 . . . are supplied with input signals, such as test patterns. The external output terminals 52-1 . . . output signals, such as test results. The external control terminals 53-1 53-2 are supplied with a test enable signal "testen" and a mode switching signal "mode", respectively.

The semiconductor device 20 also includes selector circuits 61-11, 61-12 . . . ; 61-31 . . . ; 63-11, 63-12 . . . ; 63-21, 63-22 . . . ; 63-31 . . . ; 63-41 . . . ; 62-11; 62-12 . . . ; and 62-21 . . . , which are connected between the external terminals 51-1, 51-2, . . . 52-1, . . . and the logic circuit 30 and the flash ROM 40. The selector circuits 61-11, 61-12 . . . ; 61-31 . . . ; 63-11, 63-12 . . . ; 63-21, 63-22 . . . ; 63-31 . . . ; and 63-41 . . . function to switch a path between a test mode and normal operation mode. The selector circuits 62-11; 62-12 . . . ; and 62-21 . . . is operable in response to the mode selection signal "mode", which designates an input/output path.

The selector circuits 61-11, 61-12, . . . , connected to the external terminals 51-1, 51-2, . . . , select one from between an input path (doted line) for normal operation mode and an input path (solid line) for test operation mode in response to the test enable signal "testen". Output terminals of the selector circuits 61-11, 61-12, . . . are connected to input terminals of the selector circuits 62-11, 62-12, . . . . The selector circuits 62-11, 62-12, . . . select one from between an input path for the logic circuit 30 and an input path for the flash ROM 40 in response to the mode selection signal "mode", inputted from the external control terminal 53-2. Output terminals of the selector circuits 62-11, 62-12, . . . are connected to input terminals of the selector circuits 63-11 and 63-21, 63-12 and 63-22, . . . , respectively.

The selector circuits 63-11, 63-12, . . . select one from between an input path (doted line) for normal operation mode and an input path (solid line) for test operation mode in response to the test enable signal "testen". Output terminals of the selector circuits 63-11, 63-12, . . . are connected to input terminals of the logic circuit 30. The selector circuits 63-21, 63-22, . . . select one from between an input path (doted line) for normal operation mode and an input path (solid line) for test operation mode in response to the test enable signal "testen". Output terminals of the selector circuits 63-21, 63-22, . . . are connected to input terminals of the flash ROM 30.

The selector circuits 63-31, . . . , connected to an output terminal of the logic circuit 30 and the selector circuits 63-41, . . . , connected to an output terminal of the flash ROM 40 are functioning to select one from between an input path (doted line) for normal operation mode and an input path (solid line) for test operation mode in response to the test enable signal "testen". Output terminals of the selector circuits 63-31, . . . and 63-41, . . . are connected to input terminals of the selector circuits 61-31, . . . . The selector circuits 61-31, . . . is functioning to select one from between an input path (doted line) for normal operation mode and an input path (solid line) for test operation mode in response to the test enable signal "testen". Output terminals of the selector circuits 61-31, . . . are connected to the external terminals 52,1, . . . .

Assuming that the logic circuit 30 and the flash ROM 40 have the same number of terminals, the external terminals 51-1, 51-2, 52-1, . . . and the selector circuits 61-11, 61-12, 61-21, 62-11, 62-12, 61-31, . . . can be used commonly.

Test Operation

Figure 5:
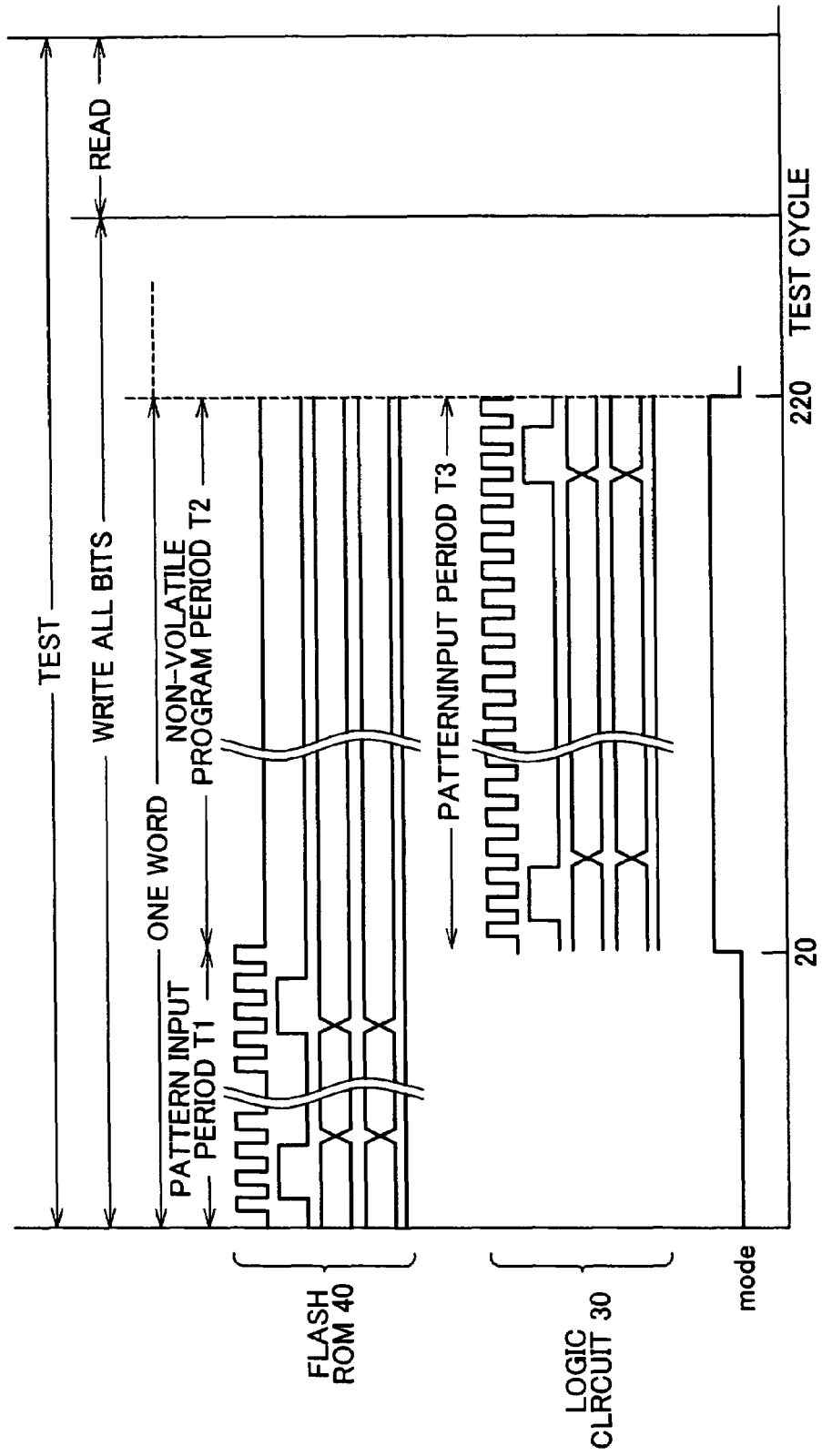
FIG. 5 is a timing chart showing a test operation of the semiconductor device, shown in FIG. 4.

FIG. 5 is a timing chart showing a test operation of the semiconductor device, shown in FIG. 4. In other words, the chart shown in FIG. 5 represents a memory test pattern for one word data to be written in the flash ROM 40.

The memory test pattern includes a memory pattern input period T1 for generating a write instruction and a program period, non-volatile program period, T2 for actual writing process. During the non-volatile program period T2, no data is written in the flash ROM 40, which can be called "waiting time" and spend 200 μs/word maximum.

According to this embodiment, a logic test pattern input period T3 is provided to have the same period of time as the non-volatile program period T2. During the logic test pattern input period T3, a test pattern is inputted to the logic circuit 30. Input modes of the flash ROM 40 and the logic circuit 30 are selected in response to the mode selecting signal "mode".

Figure 6:
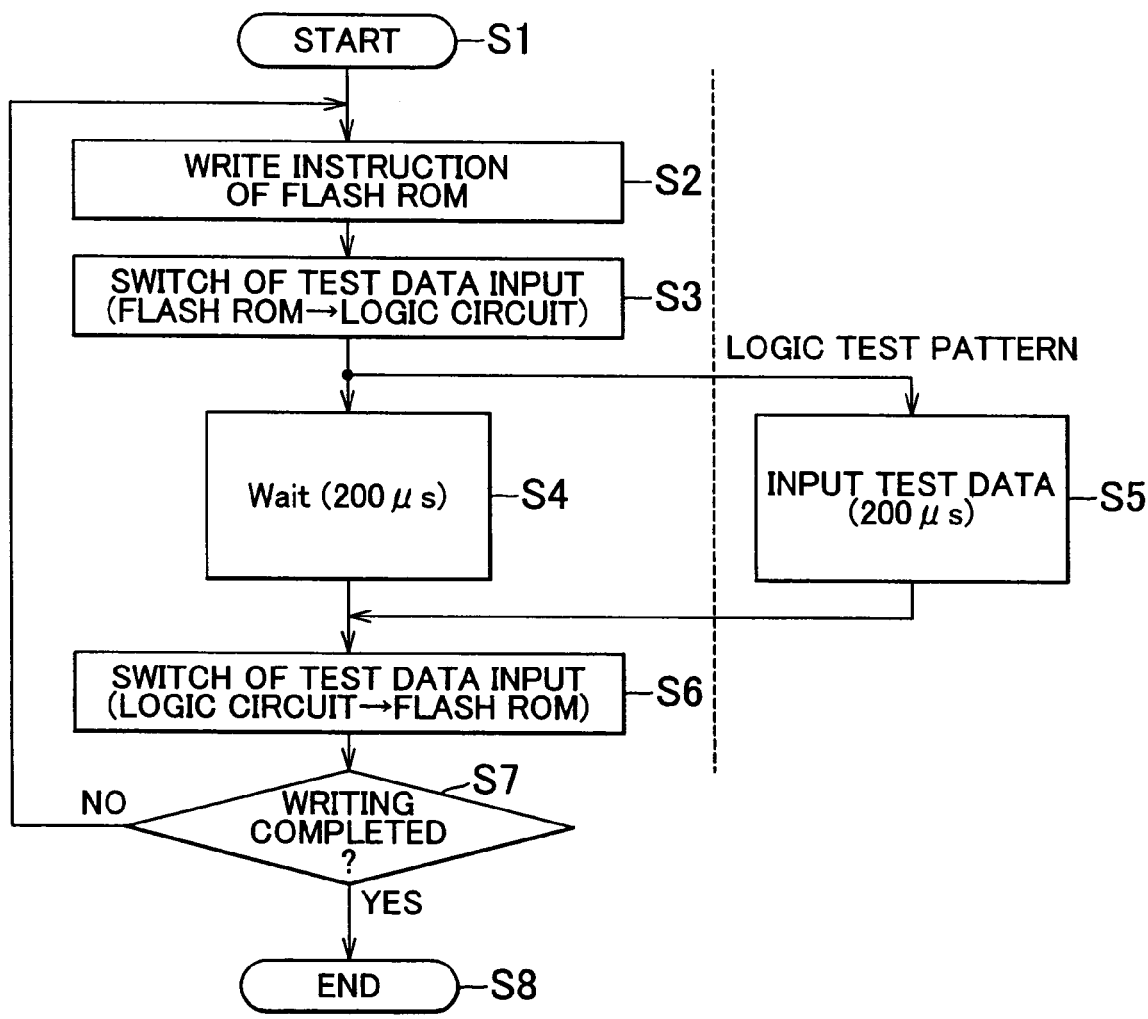
FIG. 6 is a flow chart showing a test operation of the semiconductor device, shown in FIG. 4.

FIG. 6 is a flow chart showing a test operation of the semiconductor device, shown in FIG. 4. The flow chart shows the operation of data writing for tests of the logic circuit 30 and the flash ROM 40.

In the flow chart, the program starts at Step S1. After that, the output terminals of the selector circuits 62-1, 62-12, . . . are connected to the flash ROM 40, and the input terminals of the selectors 61-21, . . . are connected to the flash ROM 40, in accordance with the mode selection signal "mode". The selector circuits 61-11, 61-12, 61-31, 63-11, 63-12, 63-21, 63-22, 63-31, 63-41, . . . are controlled to provide the path for test operation in response to the test enable signal "testen".

At Step S2, a memory test pattern for one word of memory cell 41 is inputted from the external terminals 51-1, 51-2, . . . . During the pattern input period T1, the inputted memory test pattern is transferred to the flash ROM 40 via the selector circuits 61-11, 61-12, 62-12, 63-21, 63-22, . . . . The memory test pattern for one word data is latched by the I/O buffer data latch circuit 15. After the memory pattern input period T1, the non-volatile program period T2 starts.

At step S3, the selector circuits 62-11, 62-12, 61-21, . . . are switched and connected to the logic circuit 30 in accordance with the mode selection signal "mode". The external terminals 51-1, 51-2, . . . are switched and connected to the logic circuit 30.

At step S4, the flash ROM 40 is in a waiting mode of 200 μs during the non-volatile program period T2. Simultaneously with the non-volatile program period T2, the a logic test pattern used for testing the logic circuit 30 is inputted from the external terminals 51-1, 51-2, . . . within the logic test pattern input period T3. The logic test pattern is transferred to the logic circuit 30 via the selector circuits 61-11, 61-12, 62-11, 62-12, 63-11, 63-12, . . . . In accordance with the logic test pattern, the logic circuit 30 is tested and the test results are outputted from the external terminal 52-1, . . . via the selector circuits 63-31, 62-21, 61-31 . . . . The test results are analyzed with a tester circuit, not shown, to find out if the logic circuit 30 operates normally.

During the non-volatile program period T2, the memory test pattern for one word stored at the I/O buffer data latch circuit 15 is written in the memory cell 41 at an address designated by the row decoder 13 and the column decoder 14

When a time 200 μs is elapsed and the non-volatile program period T2 is over, the selector circuits 61-11, 61-12, 61-21, . . . are connected to the flash ROM 40 in accordance with the mode selection signal "mode" in step S7. A path for test data is now switched from the logic circuit 30 to the flash ROM 40.

At step S7, it is judged if the writing operation for all the bits in the flash ROM 40 is completed. When the writing operation is completed only for one word, the process would returns to step S2 and the same process is repeated.

When the writing operation of the memory test pattern is completed for all the bits in the flash ROM 40, the test program is over (step S8). When the program is completed, all bits of the data written in the memory cell array 11 are read out of the I/O buffer data latch circuit 15, and are outputted from the external terminals 52-1, . . . through the selector circuits 63-41, 62-21, 61-31, . . . . The outputted data are tested with a tester, not shown, to determine if the flash ROM 40 operates normally without any problems.

Figure 7:
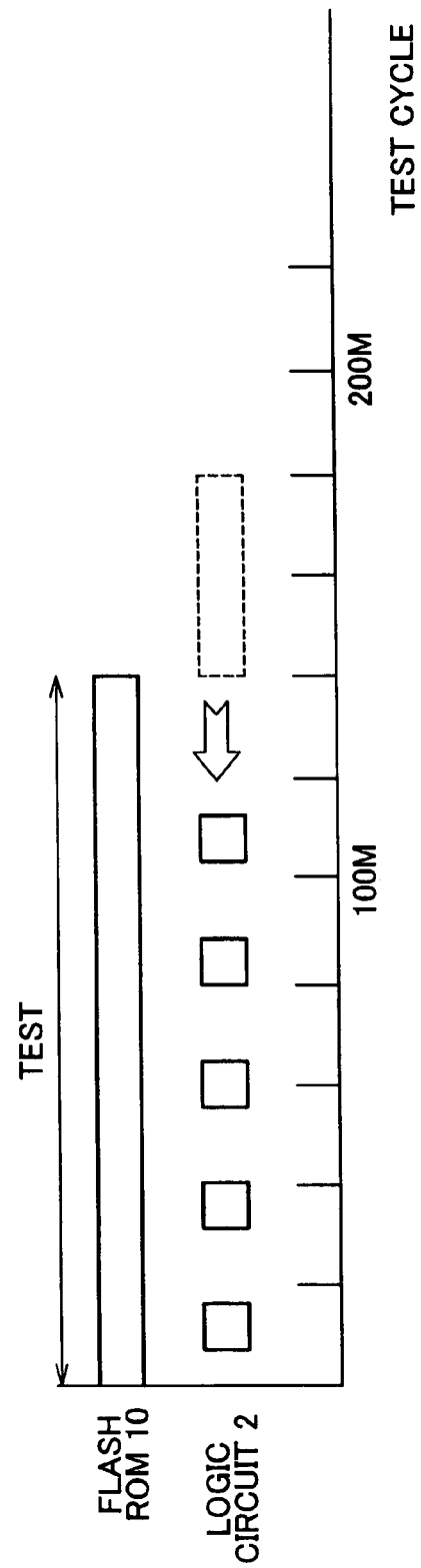
FIG. 7 is a timing chart showing an outline of test operation of the semiconductor device, shown in FIG. 4.

FIG. 7 is a timing chart showing an outline of test operation of the semiconductor device, shown in FIG. 4. According to the above described first preferred embodiment, the logic circuit 30 is tested during the non-volatile program period T2 for the flash ROM 40. As a result, as shown in FIG. 7, the total test time for a semiconductor device is remarkably shortened.

Figure 8:
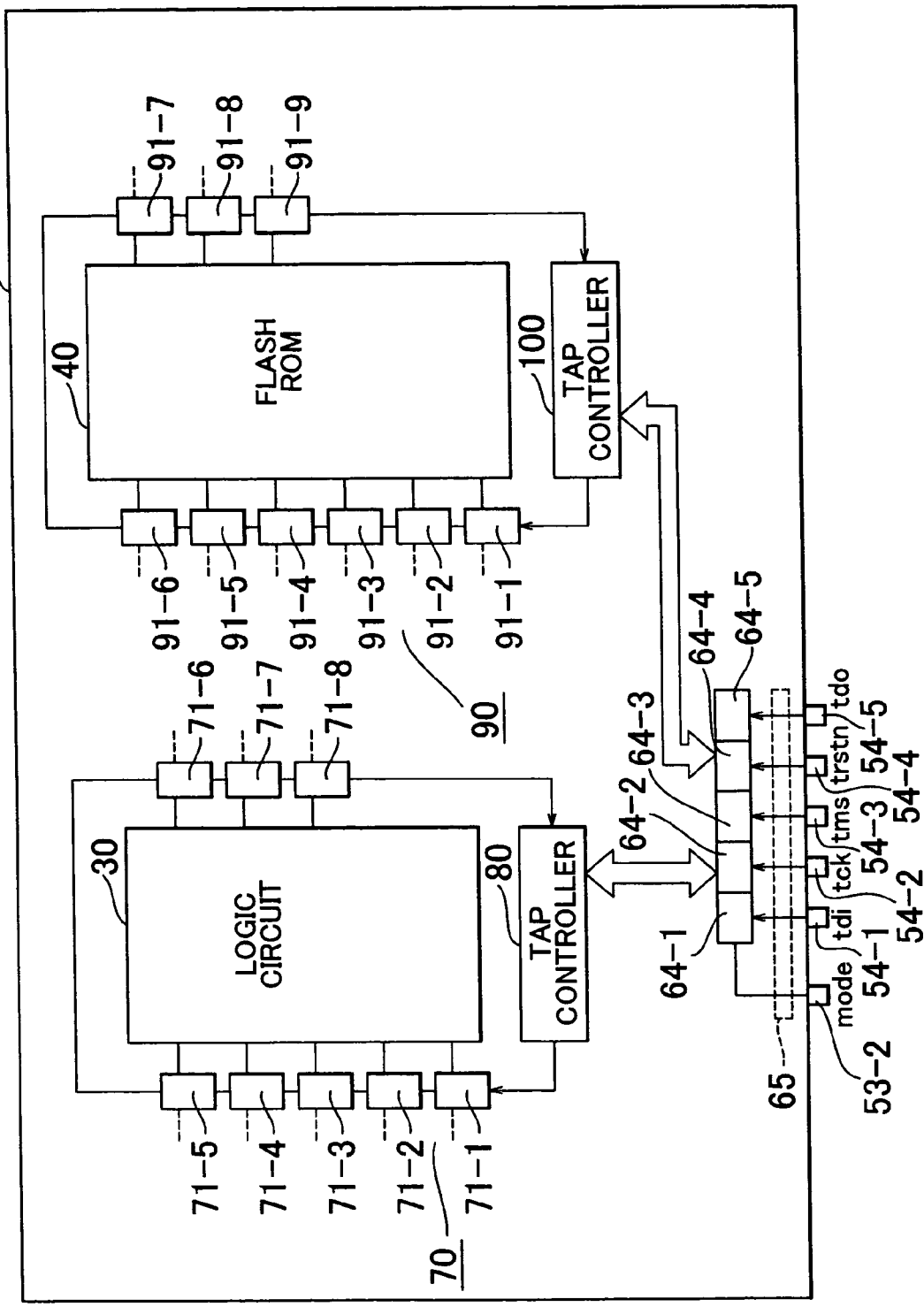
FIG. 8 is a block diagram showing a semiconductor device according to a second preferred embodiment of the present invention.

FIG. 8 is a block diagram showing a semiconductor device according to a second preferred embodiment of the present invention. In the second preferred embodiment, the same and corresponding components to those in the prior described embodiment(s) are represented by the same reference numerals.

A semiconductor device 20A includes a logic circuit 30 and a flash ROM 40, which are mounted on the same chip. According to this embodiment, a serial interface according to JTAG standard is used for inputting test data.

All terminals of the logic circuit 30 are connected to a scan chain 70, in which boundary scan registers (BSR) 71-1 to 71-8 are serially connected. The BSRs 71-1 to 71-8 are controlled by a test access port (TAP) controller 80. In the same manner, all terminals of the flash ROM 40 are connected to a scan chain 90, in which boundary scan registers (BSR) 91-1 to 91-9 are serially connected. The BSRs 91-1 to 91-9 are controlled by a test access port (TAP) controller 100.

The semiconductor device 20A also includes five external terminals TAP54-1 to TAP54-5 according to JTAG standard. In the input terminals TAP54-1 to 54-4, the external terminal TAP54-1 is supplied with a test data input signal "tdi"; the terminal TAP54-2 is supplied with a clock signal "tck", the terminal TAP54-3 is supplied with a test mode set signal "tms", and the terminal TAP54-4 is supplied with a test reset signal "trstn". The external terminal TAP54-5 is a terminal from which a test data output "tdo" is supplied.

A test pattern is inputted serially from the external terminals TAP54-1 to 54-4, and an output data is serially outputted from the external terminal TAP54-5. Serial input data are converted into parallel data at the scan chains 70 and 90 and the TAP controller 80 and 100. Parallel data supplied from the logic circuit 30 and the flash ROM 40 are converted into serial data at the scan chains 70 and 90 and the TAP controllers 80 and 100. Namely, the scan chains 70 and 90 and the TAP controllers 80 and 100 form a serial/parallel converter.

The semiconductor device 20A also includes selector circuits 64-1 to 64-5 between the external terminals TAP54-1 to 54-5 and the TAP controllers 80 and 100. The selector circuits 64-1 to 64-5 is designed to selectively connect the external terminals to the logic circuit 30 and the flash ROM 40 in accordance with the mode selection signal "mode" supplied to an external control terminal 53-2. Another selector circuit 65 is arranged between the selector circuits 64-1 to 64-5 and the external terminals TAP54-1 to TAP54-5. The selector circuit 65 is controlled by a control signal, not shown, to select a test operation mode and a normal operation mode.

Each of the BSR71-1 to 71-5 and BSR91-1 to 91-6 has the same circuitry. Each of the TAP controllers 80 and 100 also has the same circuitry.

Figure 9:
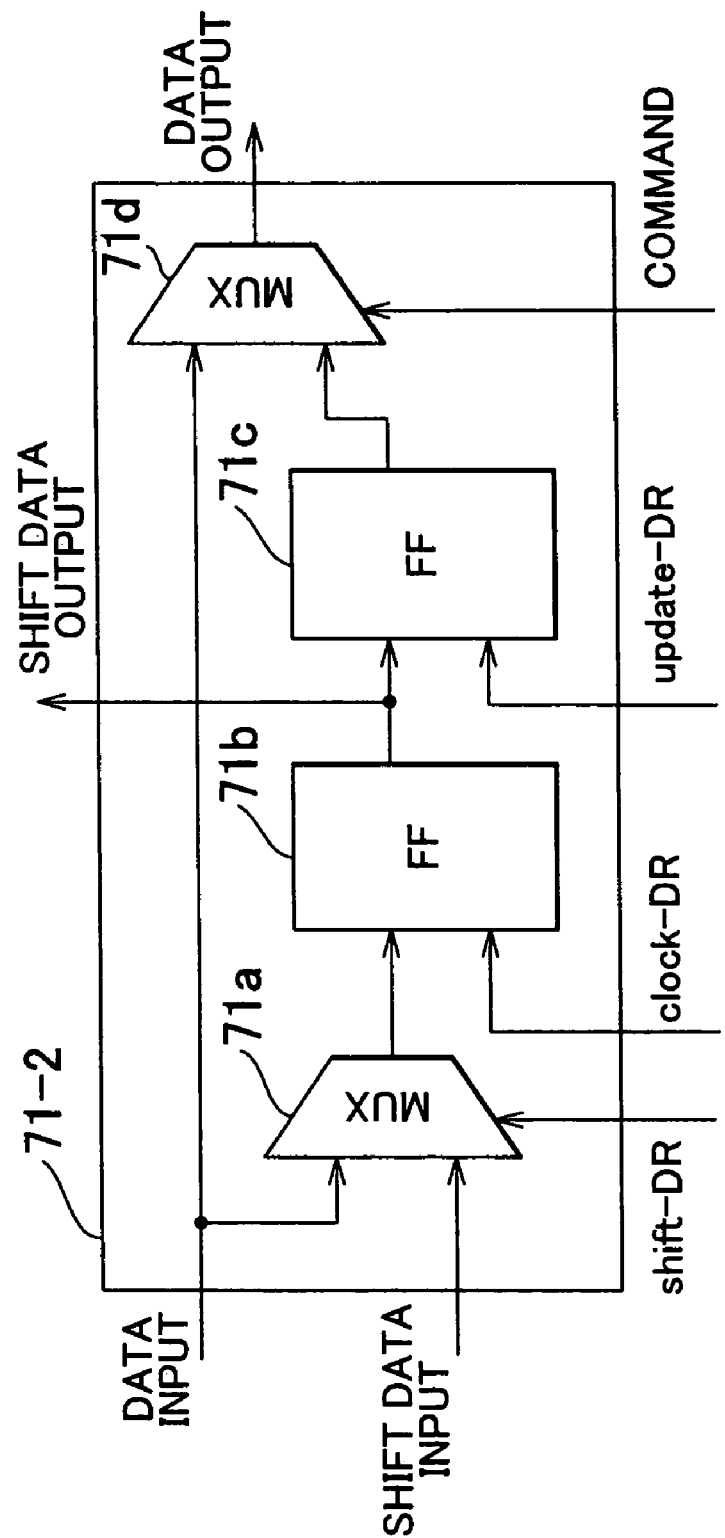
FIG. 9 is a block diagram showing the detail of a BSR, shown in FIG. 8.

FIG. 9 is a block diagram showing the detail of a BSR, shown in FIG. 8. In FIG. 9, the BSR 71-2 is sampled and described.

The BSR 71-2 is a register controlled with a boundary scan control signal supplied from the TAP controller 80. The boundary scan control signal may includes a shift signal for data register "shift-DR", a clock signal for data register "clock-DR", an update signal for data register "update-DR", and IR (Instruction Register) signal.

The BSR 71-2 includes a multiplexer (MUX) 71a, flip-flop circuits 71b and 71c, and another multiplexer 71d. The multiplexer 71a is supplied with data from another logic circuit and with shift data from the previous BSR 71-1 to select one of those two. The flip-flop circuit 71b shifts an output signal from the multiplexer 71a and supplies the shifted data to the next BSR 71-3. The flip-flop circuit 71c stores an output data of the previous flip-flop circuit 71b. The multiplexer 71d is supplied with data from another logic circuit and with output data from the flip-flop circuit 71c to select one of those two. The selected data are supplied to the logic circuit 30.

When the shift signal "shift-DR" is "0", the multiplexer 71a selects data from another logic circuit and transmits the data to the flip-flop circuit 71b. On the other hand, when the shift signal "shift-DR" is "1", the multiplexer 71a selects shift data from the previous BSR 71-1 and transmits the data to the flip-flop circuit 71b. The flip-flop circuit 71b shifts the data, supplied from the multiplexer 71a, in accordance with the clock signal "clock-DR" and transmits the shifted data to the next BSR 71-3 and to the flip-flop circuit 71c. The flip-flop circuit 71c stores the data, supplied from the flip-flop circuit 71b, in accordance with the update signal "update-DR". The multiplexer 71d selects data supplied from another logic circuit and transfers the data to the logic circuit 30, when the IR Instruction is "0". The multiplexer 71d selects data supplied from the flip-flop circuit 71c and transfers the data to the logic circuit 30, when the IR Instruction is "1".

As described above, the BSR 71-2 transfer data from the previous BSR 71-1 to the subsequent BSR 71-3, in accordance with boundary scan cell control signal (shift-DR, clock-DR, update-DR and IR command) supplied from the TAP controller 80. A test for detecting if data are normally transferred on the boundary scan path may be carried out. Further, a normal operation in which data from another logic circuit are transferred to the logic circuit 30 may be carried out.

Figure 10:
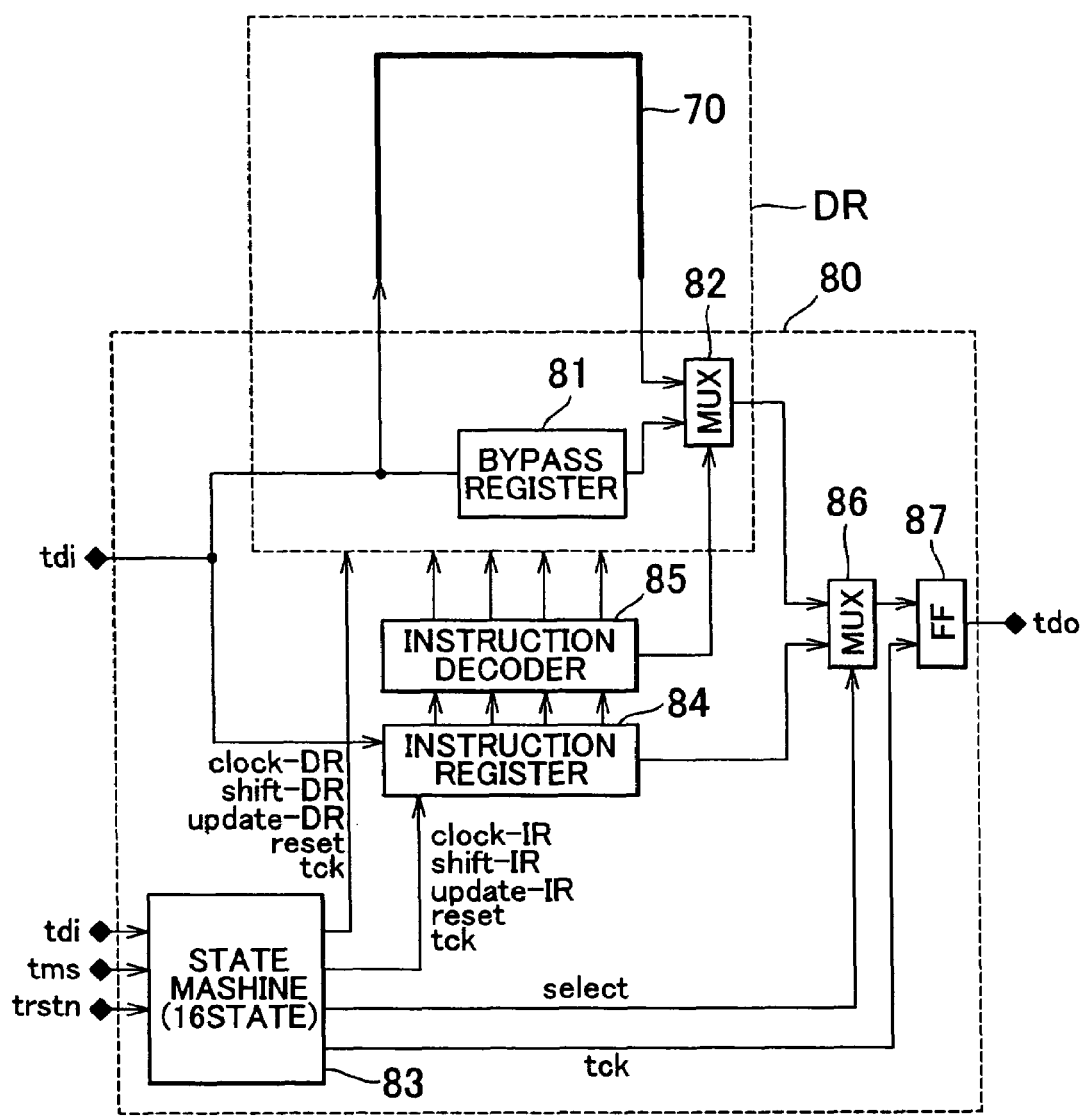
FIG. 10 is a block diagram showing the detail of a scan chain and a TAP controller, shown in FIG. 8.

FIG. 10 is a block diagram showing the detail of a scan chain and a TAP controller, shown in FIG. 8.

The TAP controller 80 includes a bypass register 81, which bypasses a test data input signal "tdi", supplied from the TAP 54-1. The test data input signal "tdi" is also supplied to the scan chain 70. The multiplexer 82 selects one from an output signal of the scan chain 70 and an output signal of the bypass register 81. The scan chain 70, bypass register 81 and multiplexer 82 form a data register DR.

The TAP controller 80 includes a state machine 83, which generate a state of 16 to control the data register DR and the instruction register 84. The state machine 83 is supplied with a test clock signal "tck", supplied from the TAP 54-2 to 54-4; a test-mode set signal "tms"; and a test reset signal "trstn". The state machine 83 outputs a control signal to be supplied to the data register DR (for example, a clock signal "clock-DR", a shift signal "shift-DR", an update signal "update-DR", a reset signal "reset" and a test clock signal "tck"); a control signal to be supplied to the instruction register 84 (for example, a clock signal "clock-IR", a shift signal "shift-IR", an update signal "update-IR", a reset signal "reset" and a test clock signal "tck"; a select signal "select" and a test clock signal "tck" to control the TAP controller 80 and the data register DR entirely.

The instruction register 84 stores a test instruction (command), in accordance with a control signal from the state machine 83. An output terminal of the instruction register 84 is connected to an instruction decoder 85 and a multiplexer MUX 86. The instruction decoder 85 decodes an output of the instruction register 84 and supplies an IR command to the data register DR.

The multiplexer MUX 86 selectively supplies an output signal of the multiplexer 82 and an output signal of the instruction register 84 to a flip-flop circuit 87 in accordance with the select signal "select" supplied from the state machine 83. The flip-flop circuit 87 is supplied with an output signal of the multiplexer 86 in accordance with the test clock signal "tck" and outputs a test data signal "tdo" to the TAP 54-5.

Using the scan chain 70 and TAP controller 80, a variety of types of boundary scan tests can be carried out. A test result is outputted from the flip-flop circuit 87 in the TAP controller 80 as a test data output signal "tdo" to the TAP 54-5.

Test Operation

According to the second preferred embodiment, in the same manner as the first preferred embodiment, shown in FIGS. 4 and 5, a logic test pattern used for testing the logic circuit 30 is inputted during the non-volatile program period T2 for the flash ROM 40. The difference from the first preferred embodiment is that a serial interface is employed for test data input in accordance with JTAG standard.

In the second preferred embodiment, a memory test pattern and a logic test pattern are serially inputted from the TAP 54-1 to 54-4 according to JTAG standard. The test patterns are converted into parallel data with the TAP controllers 80 and 100 and the scan chains 70 and 90, and are supplied to the logic circuit 30 and the flash ROM 40 to perform tests thereof in the same manner as the first preferred embodiment.

The test results are converted into serial signals with the TAP controllers 80 and 100, and are outputted from the TAP 54-5 as a test data output signal "tdo". The test data output signal "tdo" is analyzed so as to determine if the logic circuit 30 and the flash ROM 40 operate normally without any problems.

According to the second preferred embodiment, the external terminals TAP 54-1 to 54-5 are used commonly for the logic circuit 30 and the flash ROM 40, so that the circuitry, especially the circuit structure of the selectors 64-1 to 64-5, may be simplified. The same number of external terminals TAP 54-1 to 54-5 is employed even if a logic circuit and a flash memory have the different numbers of terminals. And therefore, it becomes easy to generate test patterns to be supplied to the external terminals TAP 54-1 to 54-5.

Figure 11:
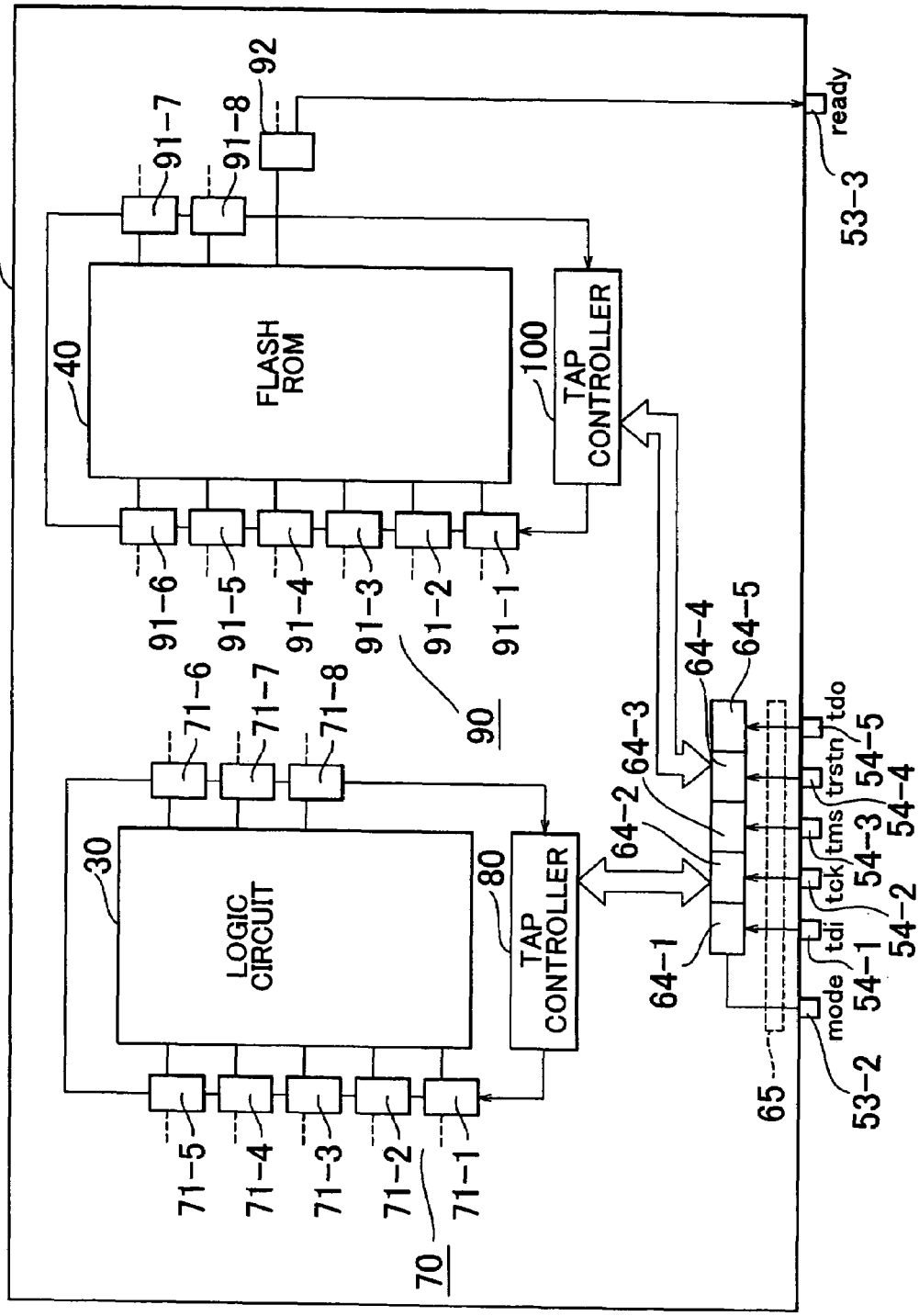
FIG. 11 is a block diagram showing a semiconductor device according to a third preferred embodiment of the present invention.

FIG. 11 is a block diagram showing a semiconductor device according to a third preferred embodiment of the present invention. In the third preferred embodiment, the same and corresponding components to those in the prior described embodiments are represented by the same reference numerals.

In a semiconductor device 20B according to this embodiment, a ready/busy signal RD/BY#, which may be supplied from a control logic circuit 16, shown in FIG. 1, is monitored. The ready/busy signal RD/BY# of "1" is taken out as a writing complete signal "ready" and is outputted from an external terminal 53-3 via a selector 92.

As well as the second preferred embodiment, external terminals TAP 54-1 to 54-5 according to JTAG standard are provided. The external terminals TAP 54-1 to 54-5 are connected to a scan chain 90 via selector circuits 65 and 64-1 to 64-5 and a TAP controller 100. The scan chain 90 includes a plurality of BSR 91-1, . . . .

Test Operation

Figure 12:
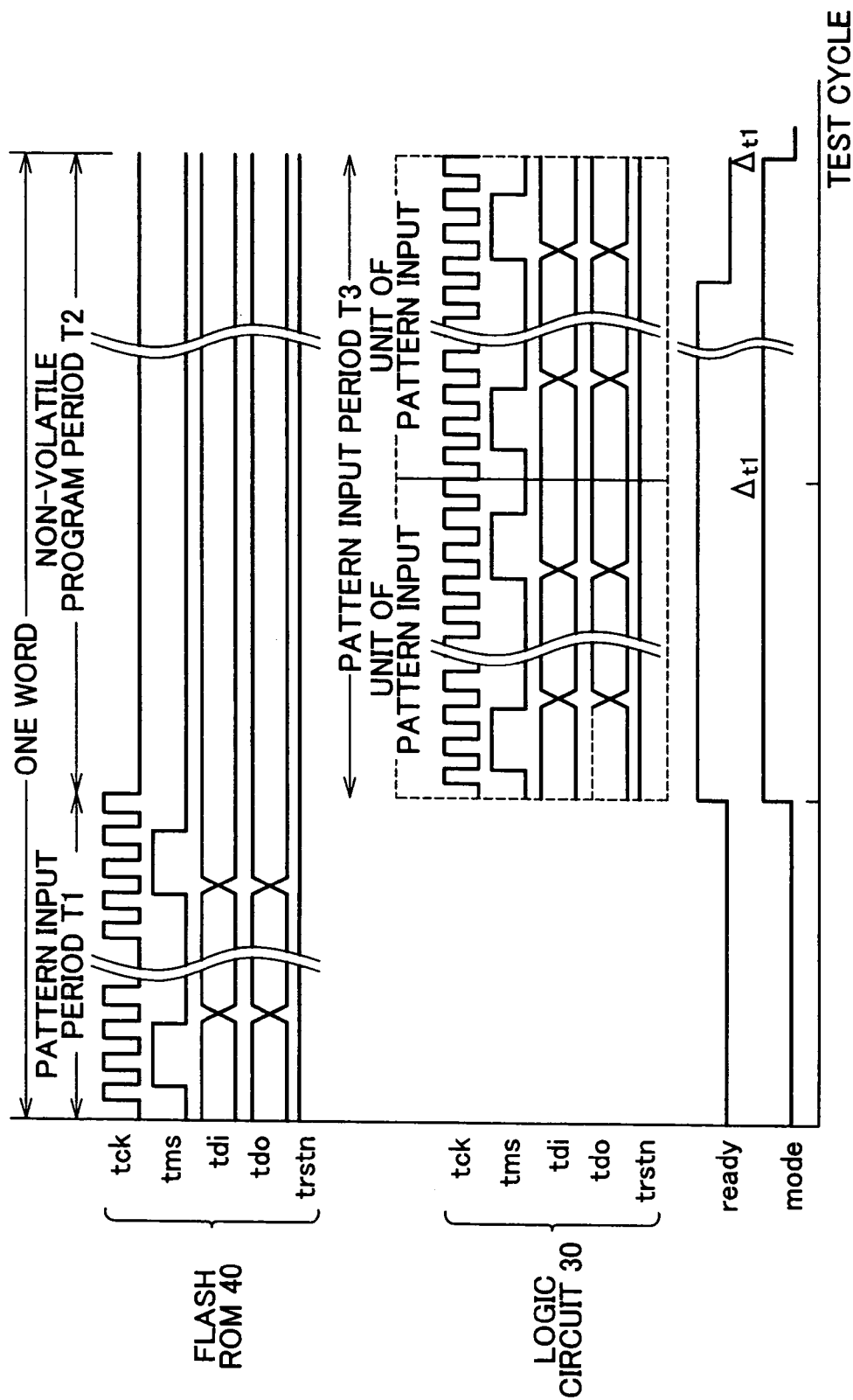
FIG. 12 is a timing chart showing a test operation of the semiconductor device, shown in FIG. 11.

FIG. 12 is a timing chart showing a test operation of the semiconductor device, shown in FIG. 11. In other words, FIG. 12 shows a test pattern for writing one word data in the flash ROM 40.

A memory test pattern for the flash ROM 40 includes a memory pattern input period T1 for writing command and a non-volatile program period T2 for an actual writing operation of data. During the non-volatile program period T2, no data is written in the flash ROM 40, which can be called "waiting time" and spend 200 µs/word maximum. Within the non-volatile program period T2, a logic test pattern used for testing the logic circuit 30 is inputted during a logic test pattern input period T3.

According to this embodiment, the writing complete signal "ready" is monitored every 1 µs (t1) with a tester connected to the external terminal 53-3. The non-volatile program period T2 can be over at a time "t1" of 1 µs, and the logic test pattern for the logic circuit 30 is designed to be completed at the time "t1" defined with the unit of 1 µs.

Figure 13:
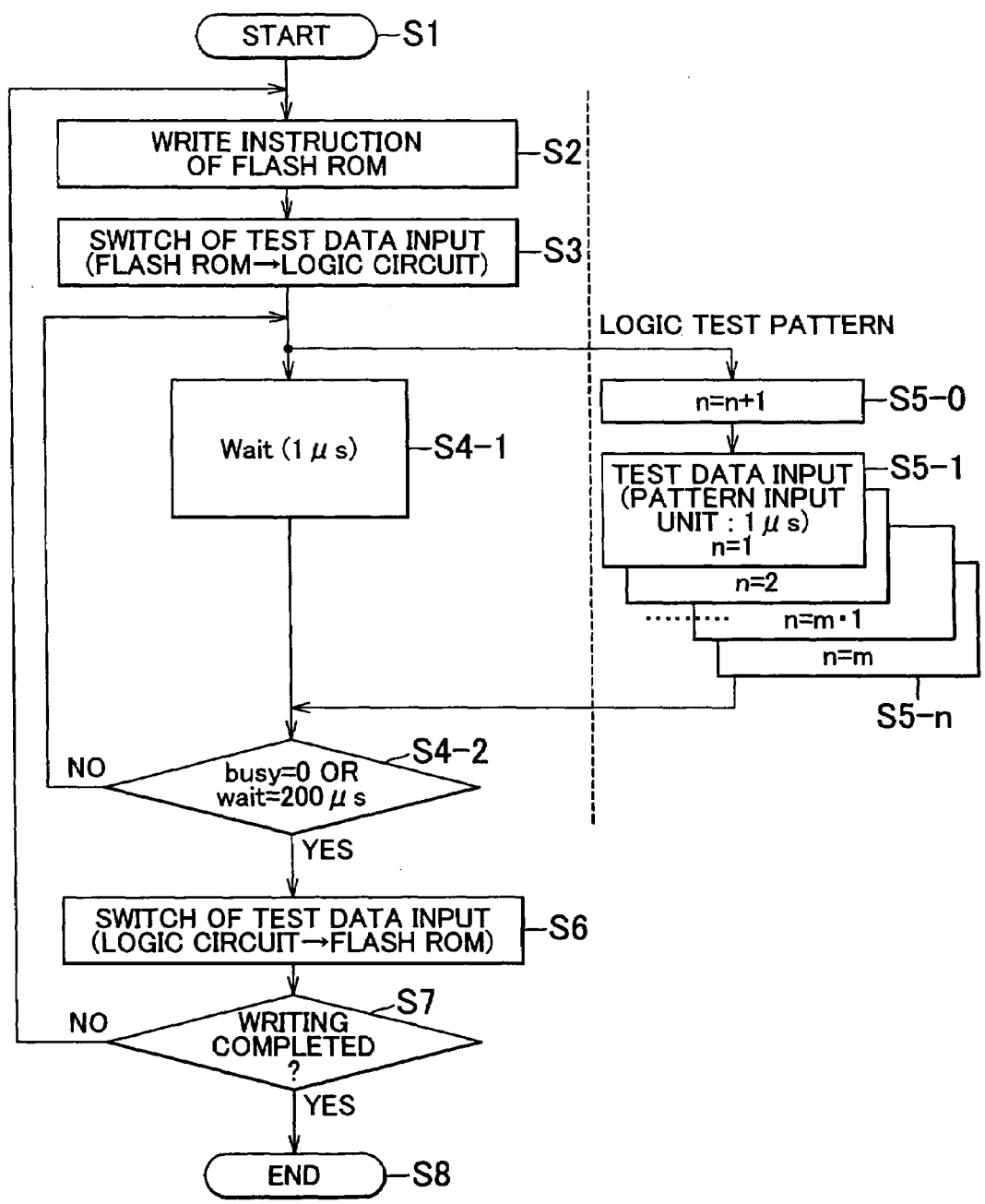
FIG. 13 is a flow chart showing a test operation of the semiconductor device, shown in FIG. 11.

FIG. 13 is a flow chart showing a writing test of the logic circuit 30 and flash ROM 40 in the semiconductor device, shown in FIG. 11.

In the flow chart, the program starts at step S1. After that, a test pattern for writing is inputted serially to the external terminals TPA 54-1 to 54-4 at step S2. The inputted serial test pattern is converted into a parallel test pattern through the selector circuits 65 and 64-1 to 64-4, the TAP controller 100 and the scan chain 90. The parallel test pattern is supplied to the flash ROM 40. After the memory pattern input period T1, the non-volatile program period T2 starts. At step S3, the selector circuits 64-1 to 64-5 are switched to connect the external terminals TAP 54-1 to 54-4 to the logic circuit 30.

After step S3, at step S4-1, 1 µs of waiting time is occurred. At the same time as the waiting time, a logic test pattern having a period of time shorter than 1 µs is inputted at steps S5-0 and S5-1. After step S4-1, the monitor external terminal 53-3 checks a writing complete signal "ready" at step S4-2. If the writing operation is completed, a path for test pattern is switched from the logic circuit 30 to the flash ROM 40 with the selector circuits 64-1 to 64-5, and the process is returned to step S2 through step S7. After that, the same operation is repeated until the writing operation is completed for all the memory cells of the flash ROM 40.

At step S4-2, if the writing operation is not completed, the process is returned to step S4-1, and 1 µs waiting is occurred. At step S5-2, a logic test pattern of a period of time shorter than 1 µs is inputted.

The writing complete signal "ready" is monitored not after the maximum period of time 200 µs for the non-volatile program period T2 is spent. If the non-volatile program period T2 exceeds 200 µs, the writing operation is forcibly terminated, and the selector circuits 64-1 to 64-5 switch a path of test pattern from the logic circuit 30 to the flash ROM 40.

At step S7, when the writing operation is completed for all of the memory cells in the flash ROM 40, the program is terminated at step S8. After that, the data written in the memory cells in the flash ROM 40 are read out and outputted as a test data output signal "tdo" from the external terminal TAP 54-5.

According to the above-described third preferred embodiment, the logic circuit 30 is tested during the non-volatile program period T2 for the flash ROM 40. As a result, the total test time for a semiconductor device is remarkably shortened.

Further, a test time for the flash ROM 40 can be shortened. When an writing operation of the flash ROM 40, having a limit of 200 µs, is completed 100 µs in average, the test time of the flash ROM 40 would be half of the conventional one.

Figure 14:
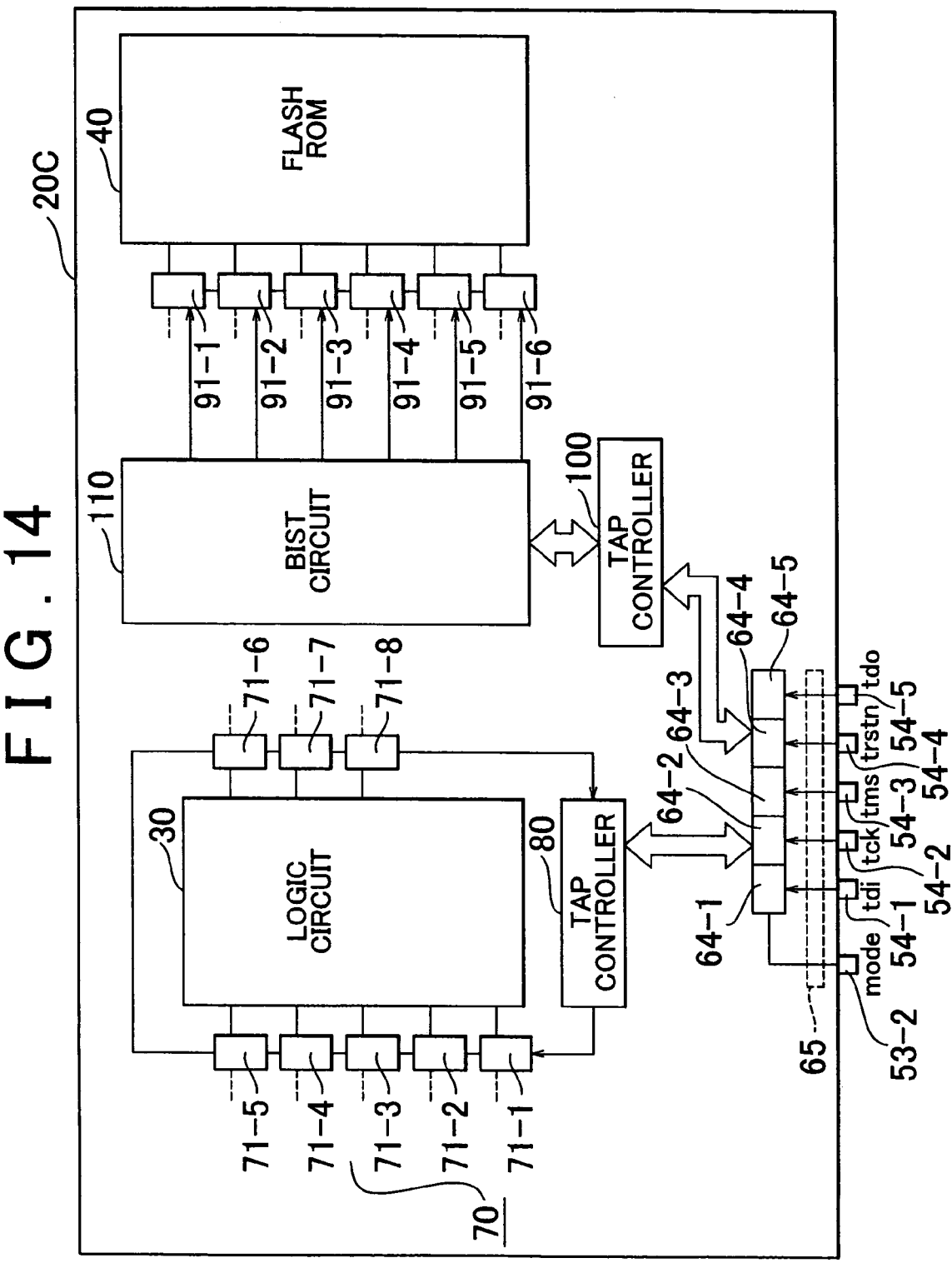
FIG. 14 is a block diagram showing a semiconductor device according to a fourth preferred embodiment of the present invention.

FIG. 14 is a block diagram showing a semiconductor device according to a fourth preferred embodiment of the present invention. In the fourth preferred embodiment, the same and corresponding components to those in the prior described embodiments are represented by the same reference numerals.

A semiconductor device 20C according to this embodiment includes a test pattern generating circuit 110 instead of the scan chain 90, shown in FIG. 8. The test pattern generating circuit 110 may be a build-in self test circuit (BIST). The semiconductor device 20C further includes selector circuits 93-1 to 93-6, . . . which connect the BIST circuit 110 to the flash ROM 40 in accordance with a predetermined control signal, not shown.

The BIST circuit 110 is a circuit to generate address signals and data used for testing the flash ROM 40. The BIST circuit 110 is controlled with a control signal supplied from external terminals TAP 54-1 to 54-5, designed according to JTAG standard, through a TAP controller 100.

Figure 15:
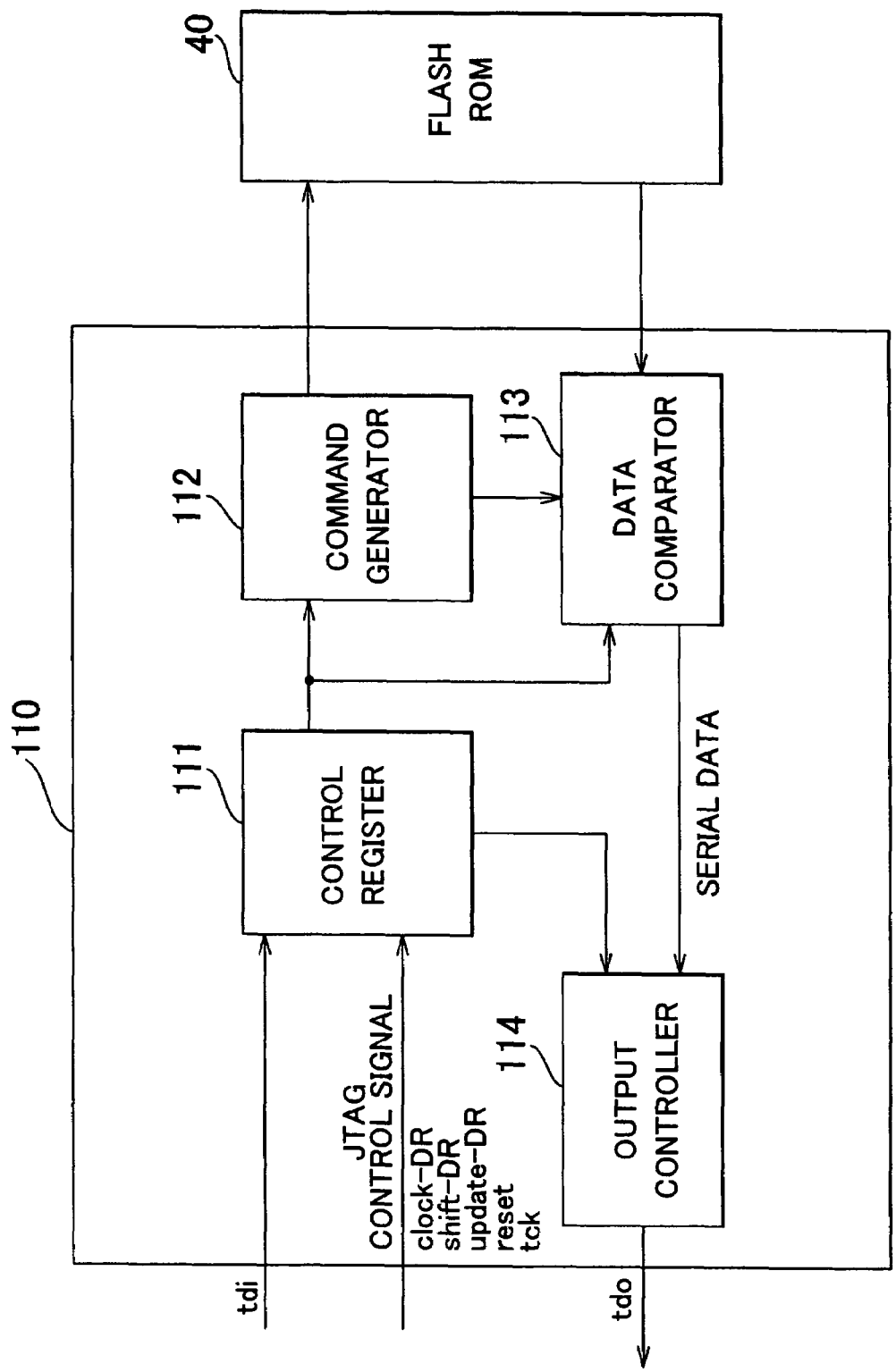
FIG. 15 is a block diagram showing the detail of a BIST circuit, shown in FIG. 14.

FIG. 15 is a block diagram showing the detail of the BIST circuit 110, shown in FIG. 14.

The BIST circuit 110 is supplied with a test data input signal "tdi" from the external terminal 54-1, and JTAG control signals from a state machine 83 in the TAP controller 100. The JTAG control signals may include a clock signal "clock-DR", a shift signal "shift-DR", an update signal "update-DR", a reset signal "reset" and a test clock signal "tck". The BIST circuit 110 generates a command signal, an address signal and a data signal and supplies those signals to the flash ROM 40.

The BIST circuit 110 includes a control register 111 to which a test data input signal "tdi" and a JTAG control signal. An output terminal of the control register 111 is connected to a command generator 112, which generates commands, and to a data comparator 113. The command generator 112 generates a command signal, an address signal and a data signal based on an output signal of the control register 111 and supplies those generated signals to the flash ROM 40.

The data comparator 113 compares read data, supplied from the flash ROM 40, with writing data, supplied from the command generator 112, and outputs a comparison result as serial data. An output terminal of the data comparator 113 is connected to an input terminal of an output controller 114. The output controller 114 is supplied with an output signal of the control register 111 and serial data outputted from the data comparator 113 to output a test data output signal "tdo". The test data output signal "tdo" is transferred to the external terminal TAP 54-5 through the TAP controller 100.

According to the fourth preferred embodiment, trigger signals, which are serial data signals, for starting up the BIST circuit 110 are supplied to the external terminals TAP 54-1 to 54-4, so that the command signal, address signal and data signal for the flash ROM 40 are generated by the BIST circuit 110.

The serial data signal is transferred to the TAP controller 100 via the selector circuits 65 and 64-1 to 64-4. In the TAP controller 100, a state machine 83 generates a JTAG signal based on the serial data signal. The TAP controller 100 transfers the JTAG signal together with a test data input signal "tdi", supplied from the TAP 64-1, to the BIST circuit 110. In the BIST circuit 110, the command generator 112 generates the command signal, address signal and data signal and transfers those signals to the flash ROM 40 for writing operation.

In the BIST circuit, the data comparator 113 compares the data written in the flash ROM 40 with writing data, and the comparison result is transferred as serial data to the output controller 114. The output controller 114 supplies a test data output signal "tdo", which is outputted through the TAP controller 100 and selector circuits 64-5 and 65 from the TAP 54-5.

According to the fourth preferred embodiment, the number of test patterns used for testing the flash ROM 40 can be remarkably reduced, so that the testing time for the flash ROM 40 is shortened. If all of the command signal, address signal and data signal are supplied as serial data to the external terminals TAP 54-1 to 54-4, forty test cycles would be required for each word. On the other hand, according to this embodiment, it is only required to spend several cycles for inputting the start-up signals to the BIST circuit 110.

Modifications and Alterations

A variety of types of logic circuits are applicable to the present invention other than a CPU.

A plurality of logic circuits and a single flash ROM can be included in a semiconductor device according to the present invention.

The present invention is applicable to a semiconductor deice, in which a flash ROM is mounted in a separated multi-chip package. In other words, a flash ROM and a logic circuit may be mounted on different chips.

What is claimed is:

1. A method for testing a semiconductor device, comprising:
    inputting a first test signal for a memory circuit during a first period of time;
    performing a writing operation of the memory circuit in accordance with the first test signal during a second period of time; and
    within the second period of time, inputting a second test signal for a logic circuit and performing a test operation of the logic circuit.

2. A method according to claim 1, wherein the first and second test signals are inputted as parallel data.

3. A method according to claim 1, wherein the first and second test signals are inputted as serial data.

4. A method according to claim 3, further comprising: generating a first test pattern based on the first test signal.

5. A method according to claim 1, wherein the first and second test signals are predetermined test patterns.

6. A method according to claim 1, further comprising: monitoring the writing operation of the memory circuit every predetermined period of time to detect when the writing operation is completed.

7. A method according to claim 1, further comprising: terminating the second period of time in the middle when the writing operation of the memory circuit is detected to be completed.

8. The method according to claim 1, wherein the memory circuit is a flash ROM.

9. The method according to claim 1, wherein the memory circuit is a type of memory that has a writing speed extremely slower than the logic unit.

10. A method for testing a semiconductor device, comprising:
    inputting a memory test pattern for testing a memory circuit;
    after inputting the memory test pattern, writing the memory test pattern in the memory circuit during a non-volatile program period;
    connecting external terminals to a logic circuit via selector circuits; and
    inputting a logic test pattern for testing the logic circuit from the external terminals within the non-volatile program period.

11. The method according to claim 10, wherein the external terminals are connected to the logic circuit within the non-volatile program period before inputting the logic test pattern.

12. The method according to claim 10, wherein the memory circuit is a flash ROM.

13. A method for testing a semiconductor device, comprising:
    supplying a first input test signal and a second input test signal to an external input terminal;
    selectively coupling a memory circuit and a logic circuit to the external input terminal;
    when the memory circuit is coupled to the external input terminal, performing a first test of the memory circuit in accordance with the first input test signal, wherein the first test includes, (1) inputting of the first input test signal to the memory circuit and, (2) writing the first input test signal in the memory circuit; and
    during the writing of the first input test signal, coupling the logic circuit to the external input terminal, and, during the writing of the first input test signal, performing a second test of a logic circuit in accordance with the second input test signal.

14. The method according to claim 13, further comprising:

provide a first test result signal in accordance with the first test;

providing a second test result signal in accordance with the second test;

selectively coupling the memory circuit and the logic circuit to an external output terminal; and selectively outputting the first and second test result signals from the external output terminal.

* * * * *